June 4, 1963 T. J. KAYE, JR., ET AL 3,092,733

FOUR ZONE TRANSISTOR HAVING INTEGRAL DIODE FORMED ON BASE REMOTE FROM TRANSISTOR

Filed July 16, 1959 2 Sheets-Sheet 1

INVENTORS
Theodore J. Kaye, Jr
Richard H. Vogt
BY Francis W. Crotty
ATTORNEY

June 4, 1963 T. J. KAYE, JR., ET AL 3,092,733
FOUR ZONE TRANSISTOR HAVING INTEGRAL DIODE FORMED ON BASE REMOTE FROM TRANSISTOR
Filed July 16, 1959 2 Sheets-Sheet 2
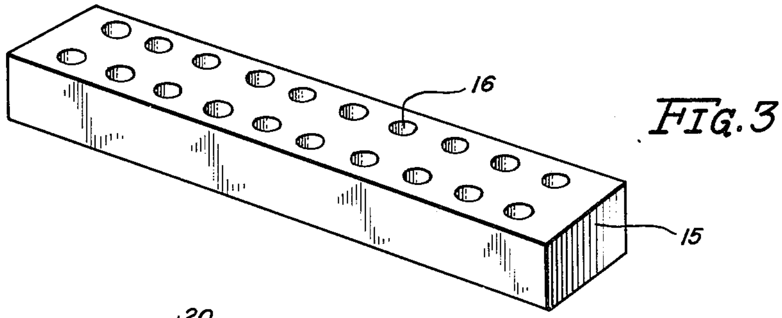
FIG. 3
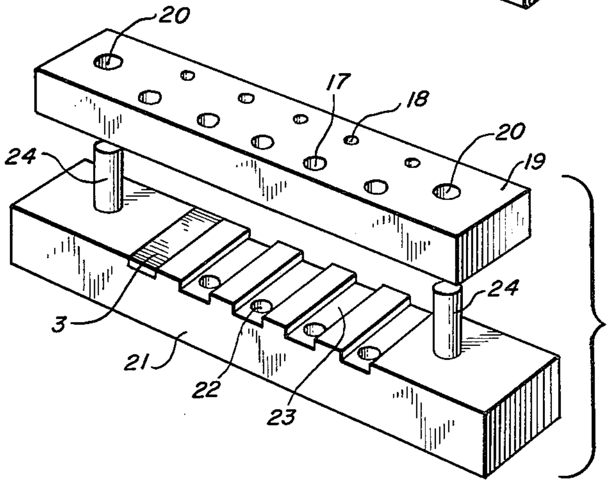
FIG. 4
FIG. 5
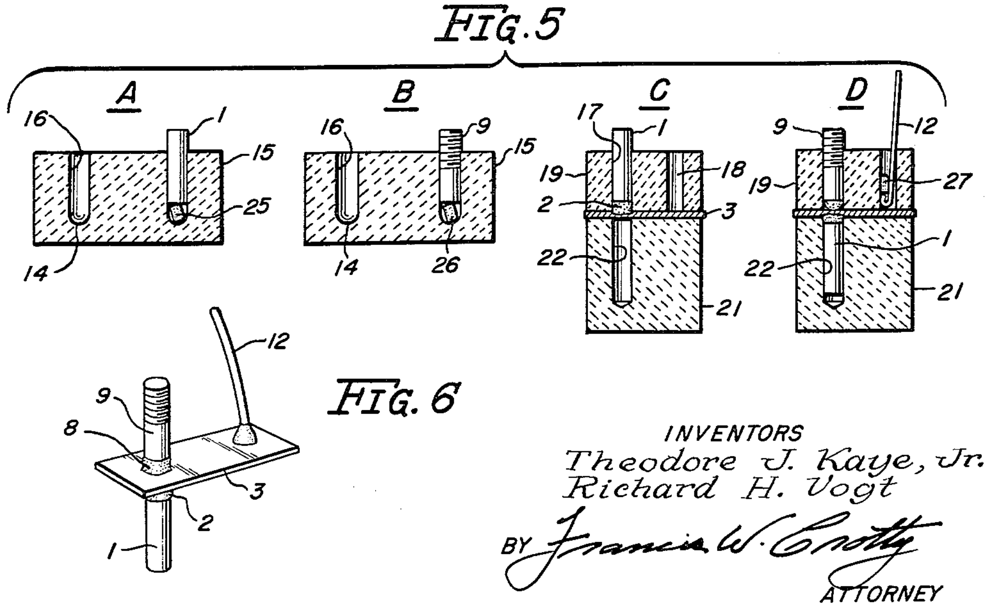
FIG. 5, FIG. 6
INVENTORS
Theodore J. Kaye, Jr.
Richard H. Vogt
BY Francis W. Crotty
ATTORNEY United States Patent Office 3,092,733

Patented June 4, 1963

3,092,733

FOUR ZONE TRANSISTOR HAVING INTEGRAL DIODE FORMED ON BASE REMOTE FROM TRANSISTOR

Theodore J. Kaye, Jr., Franklin Park, and Richard H. Vogt, Chicago, Ill., assignors to The Rauland Corporation, a corporation of Illinois Filed July 16, 1959, Ser. No. 827,654
4 Claims. (Cl. 307—88.5)

The present invention relates to semiconductor devices, more particularly to such devices of the type that may be used in switching applications in place of relays, thyratrons, gas tubes, and the like, and to methods of fabricating such devices.

It is well known in the art that a negative resistance region may be obtained in the volt-ampere characteristics of the collector circuit in transistors. Some use of this property has been made with point contact transistors in switching applications. However, low injected carrier densities and instability have limited such devices to low current operation. Later methods overcome this disadvantage by using diffused junctions, but here simplicity of construction is sacrificed. Alloy junction devices such as those described in the copending application of Adolph J. Wolski, Serial No. 722,517, filed March 19, 1958, for Semiconductor Devices, and assigned to the present assignee, are superior in their simplicity of construction and are entirely satisfactory in certain applications but are not adapted for use in certain other circuit applications.

From the circuit design standpoint, it is desirable that a semiconductor switching device be controlled from a source of voltage of smaller magnitude than the voltage switched in the load. Present semiconductor switching devices of the types previously mentioned, however, can normally be used to achieve this result in full-wave A.C. circuit applications only with the addition of steering diodes and/or diodes in series with the load.

This may be more clearly understood from consideration of a basic circuit, such as the common emitter configuration. When the base voltage is lower than the peak forward voltage at the collector, the bias source being of low impedance, majority current is permitted to flow from the base into the collector circuit. It may be seen readily that this current may be effectively blocked by the addition of a diode in the base circuit or one in series with the A.C. source. As a diode placed in the base circuit would be required to handle less current than one placed in series with the load, the former would seem preferable. Use of a base circuit diode, however, has the disadvantage that a change of bias current necessary to effect control of the switching point of the reversed biased collector produces a transistor action when the collector is forward biased. This may well be expected for in this polarity configuration there is, in effect, a common collector circuit. From this it may be seen that as the bias is increased to hold off higher voltages in the reverse direction of collector biasing, the conduction in a forward bias condition also increases. Further, this increased conduction through the device in a forward direction tends to destroy it through heating, as the impedance of the load in switching circuits is generally low and cumulative avalanche multiplication occurs. Consequently, in a practical A.C. application a diode in series with the load is customarily employed, despite the fact that this imposes a requirement for higher power rating of the diode.

It is a principal object of this invention to provide a new and improved semiconductor device which overcomes one or more of the disadvantages and/or limitations of prior semiconductor devices.

Another object of this invention is to provide a new and improved method of constructing semiconductor devices which readily lends itself to mass production, not being dependent upon complicated techniques.

Still another object of this invention is to provide a new and improved semiconductor switching device in which a low-voltage, low-current source controls a high voltage and high current.

It is a further object of this invention to provide a semiconductor switching device which exhibits minimal transistor action when the collector is forward biased.

Yet another object of this invention is to provide an alloy-junction semiconductor switching device in which a low-voltage, low-current source may effect control of a high-voltage, high-current load without the use of auxiliary diodes.

It is also an important object of the invention to provide a semiconductor device of new and improved mechanical construction, to facilitate mounting and handling of the device after fabrication.

A semiconductor device, constructed in accordance with the invention, comprises a body of semiconductive material of predetermined conductivity type and an emitter junction within a first portion of the body. A zone having an intermediate heavily doped layer of the predetermined conductivity type between the body and a region of material of opposed type conductivity forms a collector junction within a second portion of the body. A rectifying junction within a third portion of the body is located at a distance from the zone in excess of the diffusion length in the body.

The features of this invention which are believed to be novel are set forth with particularity in the appended claims. The organization and manner of operation of the invention, together with further objects and advantages thereof, may best be understood with reference to the following description taken in conjunction with the accompanying drawings, in which like reference numerals refer to like elements in the several figures, and in which:

FIGURE 3 is a perspective view of a piece of manufacturing apparatus used in the construction of the device of FIGURE 1;

FIGURE 4 is an exploded perspective view of another piece of manufacturing apparatus used in the construction of the device of FIGURE 1;

FIGURES 5A and 5B are sectional views, illustrating the use of the apparatus of FIGURE 3 in manufacturing the device of FIGURES 1 and 2;

FIGURES 5C and 5D are sectional views, illustrating the use of the apparatus of FIGURE 4 in manufacturing the device of FIGURES 1 and 2;

FIGURE 6 is a perspective view of a device constructed in accordance with the present invention and disassociated from its mountings;

Figures 1, 2:
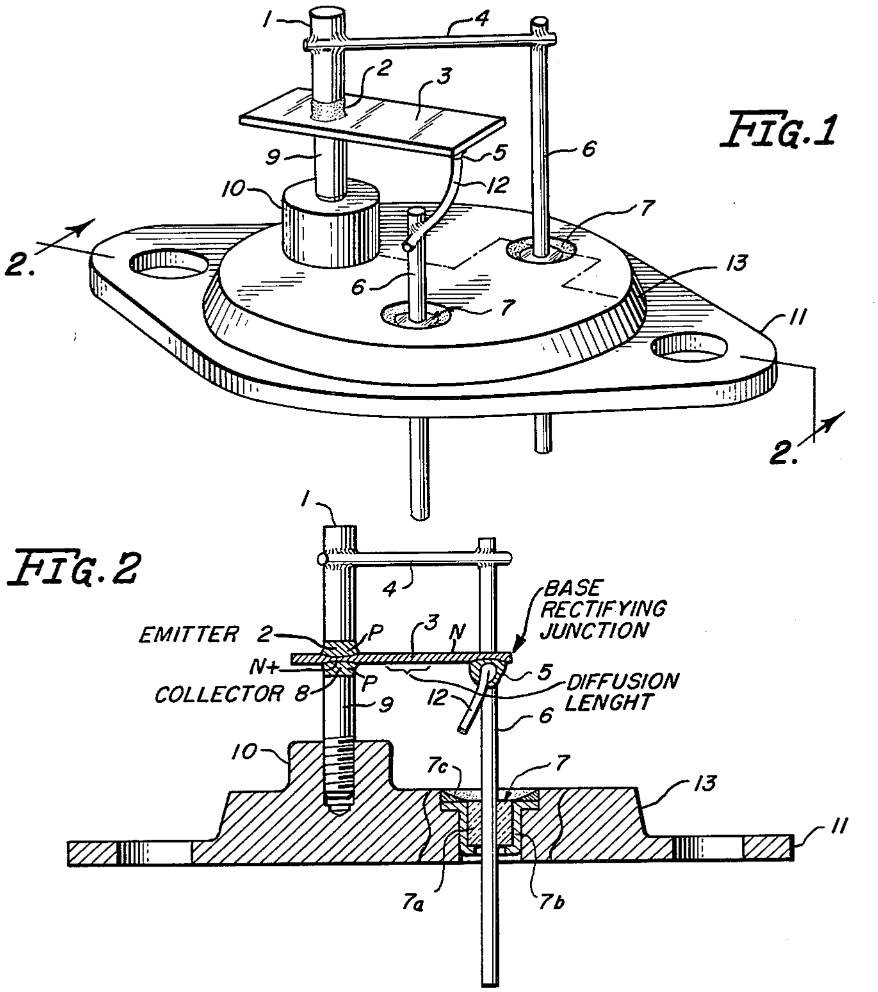
FIGURE 1 is an enlarged perspective view of a semiconductor device constructed in accordance with the present invention mounted upon a base prior to its incapsulation.
FIGURE 2 is a sectional view taken on line 2—2 of FIGURE 1.

In FIGURES 1 and 2 is shown an alloy-junction semiconductor switching device comprising a wafer or die 3 of germanium, upon which are formed three alloy junctions 2, 5, and 8. Junctions 2 and 8, the emitter and collector junctions, are directly opposed to each other while base emitter junction 5 is spaced to one side on the same surface of germanium dice 3 as collector junction 8. Embedded in junction alloys 2, 8, and 5 are a heavy nickel emitter contact 1, a heavy threaded nickel collector contact 9, and a nickel wire base emitter contact 12, respectively. This device is mounted upon a base 11 by screwing the collector lead 9 into a threaded heatsink 10.

Heatsink 10 and mounting base 11, which may be integrally constructed, are formed of a sturdy thermally and electrically conductive material such as copper, stainless steel or the like. Electrical connections are made to base emitter junction 5 and emitter junction 2 by means of conductive leads 6 extending through hermetic seals 7 in mounting base 11. As is shown in FIGURE 2, the hermetic seals 7 each comprise a glass bead **7*a* contained within a pre-tinned metal eyelet 7*b* and bonded to the conductive lead 6. The lead assembly 6, 7*a*, 7*b* is fixed to mounting base 11 by means of solder 7*c* or the like, preferably applied with the use of induction heating to assure uniform and complete bonding of the metal eyelet 7*b* to the mounting base 11. Components 6, 7*a*, 7*b*, and 11 are constructed of materials whose temperature coefficients of expansion are as nearly matched as possible; lead assemblies 6, 7*a*, 7*b*** for this purpose are commercially available from several sources.

A cap (not shown in the drawing) of metal, glass or other suitable non-porous material may be placed over the structure and fastened by solder or other means to the boundaries of the raised portion 13 of the base 11, thus enclosing the completed device and protecting it from moisture and other contaminants. The enclosure is preferably filled with dry nitrogen but other inert or non-reactive gases or vacuum may be employed with satisfactory results.

In FIGURE 3 is shown a perspective view of a jig consisting of a carbon block 15 in which are drilled a plurality of holes 16. The details of this jig may be more clearly seen in FIGURES 5A and 5B. Holes 16 are of a diameter slightly greater than that of the nickel leads 1 and 9 so that the latter may just slip into them. The bottoms 14 of holes 16 are rounded.

In FIGURE 4 is shown a perspective view of a second jig comprising two carbon blocks 19 and 21; carbon block 19 is provided with holes 17, 18, and 20 drilled through it. Receses 23 are embossed in carbon block 21 and into it are drilled holes 22 of a size to accommodate the nickel leads 1. Guide pins 24 are inserted into carbon block 21.

The manufacture of the new and improved semiconductor device in accordance with the invention advantageously employs the jigs of FIGURES 3 and 4. An illustrative example is as follows:

Dice 3 are cut from N-type germanium doped with antimony to a resistivity of approximately 10 ohm-centimeters. These dice are cut to a size of approximately .100 inch by .200 inch by .020 inch. Dice 3 are lapped and then etched in a chemical etchant consisting of 20 parts 48% hydrofluoric acid, 25 parts 68% nitric acid, and 10 parts glacial acetic acid, to improve the surface conditions in accordance with customary practice. They are then washed in running deionized water, dried, and placed in recesses 23 embossed in carbon block 21. Carbon block 19 is fitted on carbon block 21, aligning itself by means of guide pins 24 which are received in holes 20 in block 19.

Nickel emitter leads 1 are placed in holes 16 in jig 15 upon pellets 25 of a P-type modifier material, or acceptor, such as 99.5 percent indium plus .5 percent gallium, by weight. This assembly, which is represented in FIGURE 5A, is heated in an oven in which has been introduced a non-oxidizing atmosphere such as hydrogen until the alloy material 25 wets to lead 1, forming a hemisphere at the end of the lead due to the contour of the bottom 14 of holes 16 in carbon block 15. After the assembly has been heated it is removed from the oven and cooled.

The leads thus formed are removed from the jig and placed in holes 17 of jig block 19 shown in FIGURE 4 so that the alloy material 25 at the ends of leads 1 rests upon the upper surfaces of germanium dice 3. This assembly, which is represented in FIGURE 5C, is then heated in a suitable oven, again using a hydrogen or an inert non-oxidizing atmosphere, until alloy junction 2 is formed, at whcih time the jig is removed from the oven and cooled. An oven temperature of 450 degrees centigrade and a time of seven minutes are satisfactory. The cross-sectional view of FIGURE 5C shows clearly the germanium die 3 with nickel lead 1 embedded in the junction alloy 2 after this operation.

The jig is disassembled by removing block 19 from block 21, and the germanium die 3 is inverted so that emitter lead 1 fits into hole 22 in carbon block 21. Carbon block 19 is then again fitted upon block 21. Threaded collector leads 9 are prepared in the same manner as emitter lead 1; their placement in jig 15 for this purpose being clearly seen in FIGURE 5D. In this case, the alloy material 26 may consist of N-type and P-type materials such as antimony and gallium in a one-to-one atomic ratio, diluted by a carrier material such as indium so that the combined concentration of antimony and gallium is about 5 percent by weight of the total mixture. The assembly is heated in an oven as was the assembly for emitter lead 1, removed from the oven and cooled.

The leads 9 are removed from jig 15 and placed in holes 17 of carbon block 19 so that the alloy material 26 rests upon the surfaces of germanium die 3 opposite emitter leads 1. Into the holes 18 in carbon block 19 are dropped a looped base emitter contact wire 12 and upon it a pellet 27 of P-type modifier material such as 99.5 percent indium plus .5 percent gallium. The jig is again placed in a suitable oven and heated to form on each germanium die 3 a collector alloy junction 8 and a base emitter junction 5. These junctions may be formed by using generally the same time and temperature cycle employed in forming the emitter junctions 2. The time of heating in which the alloy collector junction is formed must be controlled, however, so that a diffusion of the N-type impurities from the pellet material into the germanium die 3 may occur, forming on the surface of the germanium a localized region of heavily doped N-type germanium upon which the P-type impurities in the pellet material form a recrystallized P-junction. Baking at 450 degrees centigrade for seven minutes in an inert or non-reactive atmosphere has been found to be satisfactory to so form the junctions. FIGURE 5D more clearly shows the location of collector lead 9, base emitter wire 12, and base alloy pellet 27 on germanium die 3 to which emitter lead 1 has previously been fixed. After the junctions have been fired, the jig is removed from the oven and cooled. It is then disassembled and the finished alloy junction semiconductor switching device as shown in FIGURE 6 is removed.

The assembled device of FIGURE 6 is etched either electrolytically with an aqueous potassium hydroxide solution (20% KOH by volume) or with a chemical etchant comprising hydrofluoric and nitric acids, such as CP4, to improve the junctions by removing surface contamination and undesired metallic contacts otherwise tending to short-circuit the junctions. It is then mounted upon the base 11 by threading collector lead 9 into heatsink 10.

Figure 7:
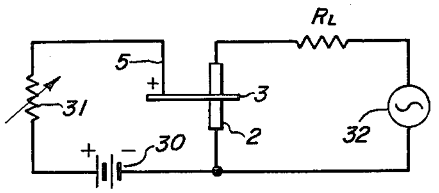
FIGURE 7 is a schematic circuit diagram illustrative of a typical circuit in which a semiconductor device made in accordance with this invention may be used.

FIGURE 7 is a schematic diagram illustrating a typical application of the device of FIGURES 1 and 2. A D.C. bias current source, such as a battery 30, and a variable resistor 31 are connected in series between base emitter junction 5 and emitter junction 2. An A.C. source 32, which may be the conventional 115-volt, 60-cycle power supply, and a load device typified by a resistor $R_L$ are connected in series between collector junction 8 and emitter junction 2. In one application, the load $R_L$ may be constituted by the field coils of a D.C. motor; in such a circuit, the speed of the motor may be controlled by varying resistor 31.

In operation, the device of FIGURES 1 and 2 is analogous in many respects to a gas-filled thyratron. The emitter-collector impedance may be switched from a high value of the order of 100,000 ohms to a low value of the order to 1 ohm, under the control of the bias current in the base-emitter circuit. For any given bias current, the instantaneous emitter-collector voltage at which switching occurs is uniquely determined; this voltage may be termed the critical or switching voltage. The critical or switching voltage may be increased or decreased by simply increasing or decreasing the bias current in the base-emitter circuit. In the absence of bias current, the forward emitter-collector impedance is continuously maintained in its low impedance state, and the device operates as a half-wave rectifier when an alternating signal voltage is applied in the load circuit; by providing variable bias current, the device serves as a variable-level clipper in cascade with a half-wave rectifier.

Figure 8:
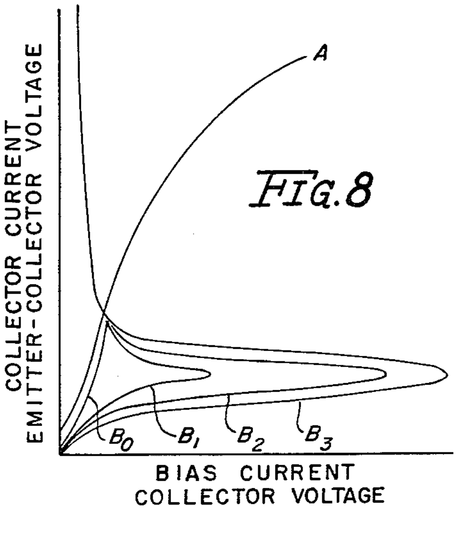
FIGURE 8 is a graphical representation of certain operating characteristics of the device of FIGURES 1 and 2.

The operation of the described device as a switch and its flexibility in respect of control are clearly portrayed by the characteristic curves of FIGURE 8. The collector junction, constructed as aforedescribed, contributes a current-voltage collector characteristic having a region of negative slope representing a transition from a high impedance to a low impedance path between the emitter and collector zones. This characteristic is controllable, at least as to the location of the negative-slope portion in a voltage domain, by variation of the base current. Curves $B_0$–$B_3$ of FIGURE 8 illustrate the current-voltage characteristics of the device at different values of base current. Increasing conditions of base current are represented by the curves having the higher subscript of their legend, that is to say, curve $B_0$ is the case where the base current is zero; curve $B_1$ is the characteristic attained with a small base current; curve $B_2$ shows the modification as the base current is increased and so forth. It is apparent that for any set of operating parameters, the peak of the collector characteristic may be likened to the critical switching potential. As the voltage increases toward that peak, the emitter-collector path has a high impedance but as the switching voltage is attained, and the negative slope region is entered upon, the impedance is transferred from its high value to a very low value represented by the steep slope termination of the characteristic curves. Curve A depicts the variation of switching potential with variations in bias current.

Typical circuit parameters are: peak applied voltage between emitter and collector—100 volts A.C. at 60 cycles per second—$R_L$ equals 100 ohms; and to hold off this voltage 500 microamperes of bias current are required with the bias source voltage as low as two or three volts. Experience has shown that devices made in accordance with this invention may switch currents which average one and one-half amperes in the load $R_L$ and withstand short-duration pulses of current as high as 5 amperes. The device may be made to control voltages in excess of 200 volts with a bias source of 3 to 4 volts. The bias current required to hold off a voltage as high as 200 volts is in the order of 2 milliamperes.

The described device features a rectifying junction 5 at the base which is to be distinguished from prior practices wherein the base is an ohmic contact. There are distinct advantages in employing a base junction because, for example, the rectifying junction prevents the undesired collector-base current loop characteristic of certain prior devices referred to in the introduction of the specification. Additionally, the forward bias of the base junction, in effect, reduces the IR drop of the wafer or die 3 represented by the portion of the die between the base junction on one hand and the emitter-collector junctions on the other. For this reason, one can space the base junction farther from the emitter and collector than would otherwise be the case which is a convenience in fabrication. It is to be pointed out, however, that in using a base junction it is necessary that the base be spaced from the emitter and collector junctions by a distance which exceeds the diffusion length in the die or wafer 3. Were this not so, a permanent low impedance condition would be established and switching could not be attained. It will be appreciated that an ohmic contact may be employed for the base, if desired. If that is done, there is no critical spacing to be observed of the base relative to the emitter and collector junctions.

Accordingly, the transistor switching device of this invention may be simply made and utilized in circuits not adaptable to presently known semiconductor devices. Devices made in accordance with this invention may be used in A.C. circuits without the addition of diodes in the base circuit or in series with the load as they show only a few microamperes of current conduction between emitter and collector in the reversed direction; that is, when the collector is at a positive potential. Further, change in bias in these devices causes no appreciable change in this amount of leakage. Devices made in accordance with the invention may switch from a high to a low impedance condition in less than 100 millimicro-seconds. Because of the simplicity of the process of this invention, it can be seen that this device may be easily prepared and is readily adapted for mass production.

While a particular embodiment of the invention has been shown and described, it is apparent that changes and modifications may be made without departing from the invention in its broader aspects. The aim of the appended claims, therefore, is to cover all such changes and modifications as fall within the true spirit and scope of the invention.

We claim:

1. A semiconductor device comprising: a body of semiconductive material of predetermined conductivity type; an emitter junction within a first portion of said body; a zone having an intermediate heavily doped layer of said predetermined conductivity type between said body and a region of material of opposed type conductivity forming a collector junction within a second portion of said body; and a rectifying junction within a third portion of said body at a distance from said zone in excess of the diffusion length in said body.

2. A semiconductor device comprising: a semiconductor wafer of predetermined conductivity type; an emitter junction within a first portion of said wafer; a zone having an intermediate heavily doped layer of said predetermined conductivity type between said wafer and a region of material of opposed type conductivity for forming a collector junction within a second portion of said body said junction contributing a current-voltage collector characteristic having a region of negative slope representing a transition from a high impedance to a low impedance path between said emitter and collector junctions; a base rectifying junction within a third portion of said body at a distance from said emitter and collector junctions in excess of the diffusion length of said wafer; means for applying a bias potential to said emitter and base to establish a reverse bias at said emitter junction to maintain a high impedance path between said emitter and collector in the absence of collector potentials less than that corresponding to said negative-slope portion of said collector characteristic; and means for applying a potential source across said emitter and collector.

3. A semiconductor device comprising: a body of semiconductive material of a predetermined conductivity type; an emitter junction within a first portion of said body; a zone having an intermediate heavily doped layer of said predetermined conductivity type between said body and a region of material of opposed type conductivity for forming a collector junction within a second portion of said body; a collector electrode alloyed at one end to said zone and threaded at its opposite end; a body having a high thermal conductivity to constitute a heat sink and further having a threaded aperture for receiving said collector electrode; and a rectifying junction within a third portion of said body at a distance from said zone in excess of the diffusion length in said body.

4. A semiconductor device comprising: a body of semiconductive material of n-type conductivity; a p-n emitter junction within a first portion of said body; a zone having an intermediate heavily doped layer of n-type conductivity between said body and a region of material of p-type conductivity for forming a collector junction within a second portion of said body; and a p-n rectifying junction within a third portion of said body at a distance from said zone in excess of the diffusion length in said body.

References Cited in the file of this patent

UNITED STATES PATENTS

| | | |
|---|---|---|
| 2,604,496 | Hunter | July 22, 1952 |
| 2,836,521 | Longini | May 27, 1958 |
| 2,852,677 | Shockley | Sept. 16, 1958 |
| 2,856,320 | Swanson | Oct. 14, 1958 |
| 2,861,229 | Pankove | Nov. 18, 1958 |

OTHER REFERENCES

"Practical Circuit for Grid Control of Thyratrons," a multiple reprint published by the Gage Publishing Co., May 1956, of articles originally published in Electrical Manufacturing Magazine. Pages 4 and 5 relied on.

"Practical Circuit for Grid Control of Thyratrons," an article appearing in the January 1956 issue of Electrical Manufacturing Magazine. Pages 70 and 71 relied on.